US010262786B2

(12) United States Patent
Kim et al.

(10) Patent No.: US 10,262,786 B2
(45) Date of Patent: Apr. 16, 2019

(54) STEPPED-WIDTH CO-SPIRAL INDUCTOR STRUCTURE

(71) Applicant: QUALCOMM Incorporated, San Diego, CA (US)

(72) Inventors: Daeik Daniel Kim, Del Mar, CA (US); Babak Nejati, San Diego, CA (US); Husnu Ahmet Masaracioglu, Del Mar, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/288,967

(22) Filed: Oct. 7, 2016

(65) Prior Publication Data
US 2018/0033537 A1 Feb. 1, 2018

Related U.S. Application Data

(60) Provisional application No. 62/366,918, filed on Jul. 26, 2016.

(51) Int. Cl.
*H03H 7/01* (2006.01)
*H03H 7/46* (2006.01)
(Continued)

(52) U.S. Cl.
CPC ..... *H01F 27/2804* (2013.01); *H01F 17/0013* (2013.01); *H01F 41/041* (2013.01); *H01L 23/49822* (2013.01); *H01L 23/5227* (2013.01); *H03H 7/0138* (2013.01); *H03H 7/463* (2013.01); *H01F 2017/004* (2013.01); *H01F 2017/0086* (2013.01); *H01L 28/10* (2013.01); *H03H 2001/0078* (2013.01)

(58) Field of Classification Search
CPC ........ H01F 27/2804; H01F 2027/2809; H03H 7/0138; H03H 7/463
See application file for complete search history.

(56) References Cited

U.S. PATENT DOCUMENTS

| 6,987,307 B2 | 1/2006 | White et al. |
| 7,071,806 B2 | 7/2006 | Masu et al. |
| (Continued) | | |

FOREIGN PATENT DOCUMENTS

| JP | 2000252124 A | 9/2000 | |
| JP | 2003017327 A | 1/2003 | |
| JP | WO 2016006676 A1 * | 1/2016 | ................ H01P 5/18 |

OTHER PUBLICATIONS

International Search Report and Written Opinion—PCT/US2017/039929—ISA/EPO—dated Oct. 26, 2017.

*Primary Examiner* — Robert J Pascal
*Assistant Examiner* — Kimberly E Glenn
(74) *Attorney, Agent, or Firm* — Qualcomm Incorporated

(57) ABSTRACT

A stepped-width, co-spiral inductor structure includes a first exterior layer having a first exterior width. The stepped-width, co-spiral inductor structure also includes a first interior layer coupled to the first exterior layer. The first interior layer includes a first interior width that is wider than the first exterior width of the first exterior layer. The stepped-width, co-spiral inductor structure further includes a second exterior layer coupled to the first interior layer. The second exterior layer includes a second exterior width that is narrower than the first interior width of the first interior layer.

16 Claims, 9 Drawing Sheets

(51) Int. Cl.
  *H01F 17/00*    (2006.01)
  *H01F 27/28*    (2006.01)
  *H01F 41/04*    (2006.01)
  *H01L 49/02*    (2006.01)
  *H01L 23/498*   (2006.01)
  *H01L 23/538*   (2006.01)
  *H01L 23/522*   (2006.01)
  *H03H 1/00*     (2006.01)

(56) References Cited

U.S. PATENT DOCUMENTS

| | | |
|---|---|---|
| 7,486,168 B2 | 2/2009 | Kim |
| 8,441,333 B2 | 5/2013 | Chiu et al. |
| 2006/0284719 A1 | 12/2006 | Lee |
| 2015/0028988 A1 | 1/2015 | Yamauchi et al. |
| 2015/0371755 A1* | 12/2015 | Im .................. H01F 27/2804 336/200 |
| 2016/0155558 A1 | 6/2016 | Groves et al. |
| 2017/0110779 A1* | 4/2017 | Hanaoka .................. H01P 5/18 |

* cited by examiner

Cross-section View 501

STEPPED-WIDTH CO-SPIRAL INDUCTOR STRUCTURE

CROSS-REFERENCE TO RELATED APPLICATION

The present application claims the benefit under 35 U.S.C. § 119(e) to U.S. Provisional Patent Application No. 62/366,918, entitled STEPPED-WIDTH CO-SPIRAL INDUCTOR STRUCTURE, filed on Jul. 26, 2016, in the names of KIM et al., the disclosure of which is expressly incorporated by reference herein in its entirety.

BACKGROUND

Field

Aspects of the present disclosure relate to semiconductor devices, and more particularly to a stepped-width, co-spiral inductor structure for high quality (Q)-factor radio frequency (RF) applications.

Background

The process flow for semiconductor fabrication of integrated circuits (ICs) may include front-end-of-line (FEOL), middle-of-line (MOL), and back-end-of-line (BEOL) processes. The front-end-of-line process may include wafer preparation, isolation, well formation, gate patterning, spacer, extension and source/drain implantation, silicide formation, and dual stress liner formation. The middle-of-line process may include gate contact formation. Middle-of-line layers may include, but are not limited to, middle-of-line contacts, vias or other layers within close proximity of the semiconductor device transistors or other like active devices. The back-end-of-line process may include a series of wafer processing steps for interconnecting the semiconductor devices created during the front-end-of-line and middle-of-line processes.

Successful fabrication of modern semiconductor chip products involves interplay between the materials and the processes employed. In particular, the formation of conductive material plating for the semiconductor fabrication in the back-end-of-line processes is an increasingly challenging part of the process flow. This is particularly true in terms of maintaining a small feature size. The same challenge of maintaining a small feature size also applies to all RF passive technologies, where high-performance components such as inductors and capacitors are built upon a highly insulative substrate that may also have a very low loss.

Passive on glass devices involve high-performance inductor and capacitor components that have a variety of advantages over other technologies, such as mount technology or multi-layer ceramic chips that are commonly used in the fabrication of mobile radio frequency (RF) chip designs (e.g., mobile RF transceivers). The design complexity of mobile RF transceivers is complicated by the migration to a deep sub-micron process node due to cost and power consumption considerations. Mobile RF transceiver design is further complicated by added circuit functions to support communication enhancements. Further design challenges for mobile RF transceivers include analog/RF performance considerations, including mismatch, noise and other performance considerations. The design of these mobile RF transceiver includes the use of passive devices to, for example, suppress resonance, and/or to perform filtering, bypassing, and coupling in high power, system on chip devices, such as application processors and graphics processors.

SUMMARY

A stepped-width, co-spiral inductor structure includes a first exterior layer having a first exterior width. The stepped-width, co-spiral inductor structure also includes a first interior layer coupled to the first exterior layer. The first interior layer includes a first interior width that is wider than the first exterior width of the first exterior layer. The stepped-width, co-spiral inductor structure further includes a second exterior layer coupled to the first interior layer. The second exterior layer includes a second exterior width that is narrower than the first interior width of the first interior layer.

A method of fabricating stepped-width, co-spiral inductor structure includes fabricating a first exterior layer having a first exterior width in a substrate. The method also includes fabricating a first interior layer coupled to the first exterior layer in the substrate. The first interior layer includes a first interior width that is wider than the first exterior width of first exterior layer. The method further includes fabricating a second exterior layer coupled to the first interior layer in the substrate. The second exterior layer includes a second exterior width that is narrower than the first interior width of the first interior layer.

A radio frequency (RF) front-end module includes a stepped-width, laminate inductor structure. The stepped-width, laminate inductor structure includes a stepped-width, co-spiral inductor structure in a substrate. The stepped-width, co-spiral inductor structure includes a first exterior layer having a first exterior width, and a first interior layer coupled to the first exterior layer. The first interior layer has a first interior width that is wider than the first exterior width of the first exterior layer. The stepped-width, co-spiral inductor structure also includes a second exterior layer coupled to the first interior layer. The second exterior layer has a second exterior width that is narrower than the first interior width of the first interior layer. The RF front-end module also includes a duplexer supported by the stepped-width, laminate inductor structure.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
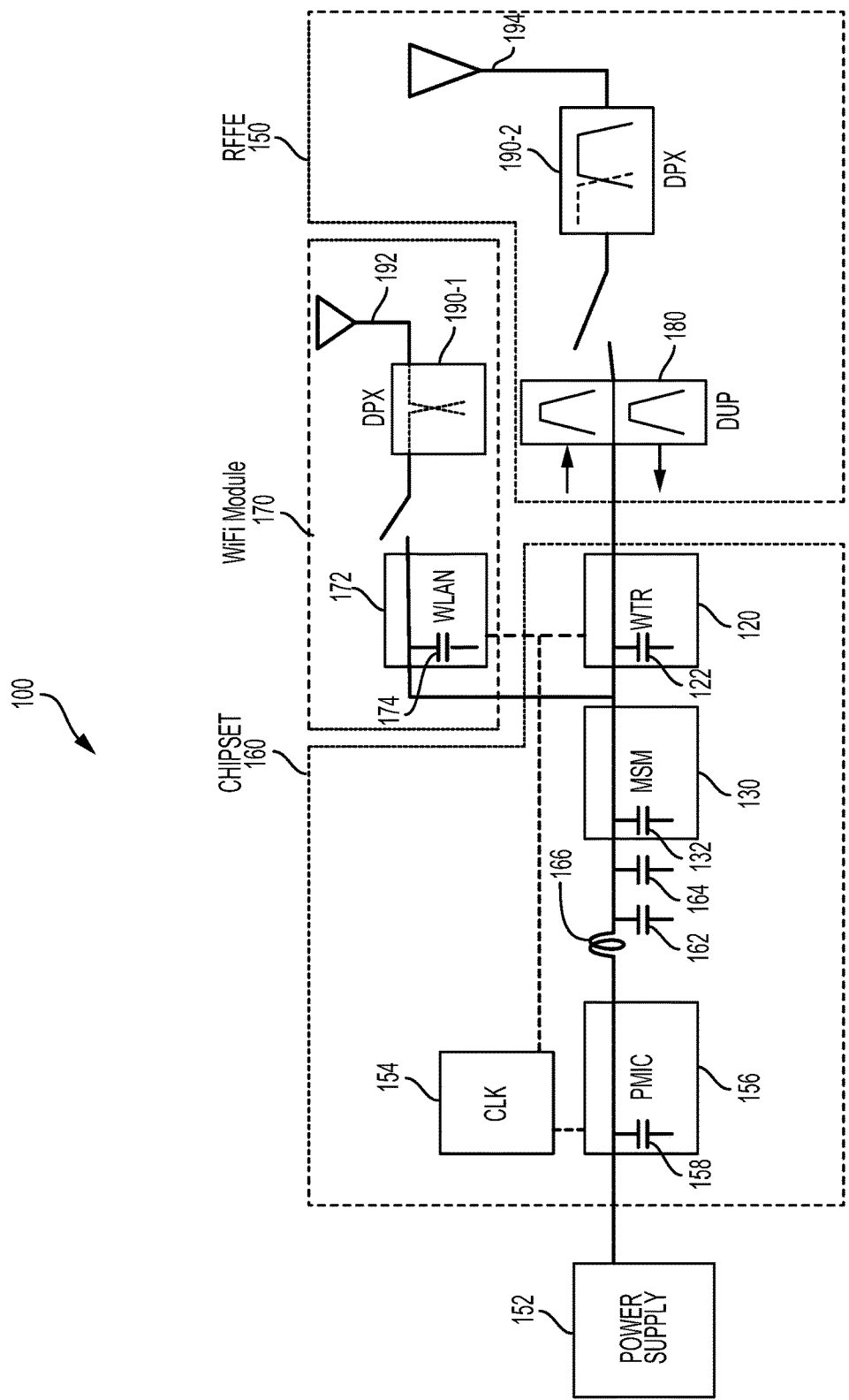
FIG. 1 is a diagram of a radio frequency (RF) communication system.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent to those skilled in the art, however, that these concepts may be practiced without these specific details. In some instances, well-known structures and components are shown in block diagram form in order to avoid obscuring such concepts. As described herein, the use of the term "and/or" is intended to represent an "inclusive OR," and the use of the term "or" is intended to represent an "exclusive OR."

Mobile radio frequency (RF) chip designs (e.g., mobile RF transceivers) have migrated to a deep sub-micron process node due to cost and power consumption considerations. The design complexity of mobile RF transceivers is further complicated by added circuit functions to support communication enhancements, such as carrier aggregation. Further design challenges for mobile RF transceivers include analog/RF performance considerations, including mismatch, noise, and other performance considerations. The design of these mobile RF transceivers includes the use of passive devices, for example, to suppress resonance and/or to perform filtering, bypassing, and coupling.

Passive on glass devices involve high-performance inductor and capacitor components that have a variety of advantages over other technologies, such as surface mount technology or multi-layer ceramic chips. These advantages include being more compact in size and having smaller manufacturing variations. Passive on glass devices also involve a higher quality (Q)-factor value that meets stringent low insertion loss and low power consumption specifications. Devices such as inductors may be implemented as three-dimensional (3D) structures with passive on glass technologies. 3D inductors or other 3D devices may also experience a number of design constraints due to their 3D implementation.

An inductor is an example of an electrical device used to temporarily store energy in a magnetic field within a wire coil according to an inductance value. This inductance value provides a measure of the ratio of voltage to the rate of change of current passing through the inductor. When the current flowing through an inductor changes, energy is temporarily stored in a magnetic field in the coil. In addition to their magnetic field storing capability, inductors are often used in alternating current (AC) electronic equipment, such as radio equipment. For example, the design of mobile RF transceivers includes the use of inductors with improved inductance density while reducing magnetic loss at high frequency (e.g., 500 megahertz (MHz) to 5 gigahertz (GHz) RF range).

Various aspects of the disclosure provide techniques for fabrication of a skewed, co-spiral inductor structure. The process flow for semiconductor fabrication of the skewed, co-spiral inductor structure may include front-end-of-line (FEOL) processes, middle-of-line (MOL) processes, and back-end-of-line (BEOL) processes. It will be understood that the term "layer" includes film and is not to be construed as indicating a vertical or horizontal thickness unless otherwise stated. As described herein, the term "substrate" may refer to a substrate of a diced wafer or may refer to a substrate of a wafer that is not diced. Similarly, the terms chip and die may be used interchangeably unless such interchanging would tax credulity. As described herein, the term "passive substrate" may refer to a substrate of a diced wafer or panel, or may refer to the substrate of a wafer/panel that is not diced. In one configuration, the passive substrate is comprised of glass, quartz, sapphire, high-resistivity silicon, or other like passive material. The passive substrate may also be a coreless substrate.

As described herein, the back-end-of-line interconnect layers may refer to the conductive interconnect layers (e.g., metal one (M1), metal two (M2), metal three (M3), etc.) for electrically coupling to front-end-of-line active devices of an integrated circuit. The back-end-of-line interconnect layers may electrically couple to middle-of-line interconnect layers for, for example, connecting M1 to an oxide diffusion (OD) layer of an integrated circuit. A back-end-of-line first via (V2) may connect M2 to M3 or others of the back-end-of-line interconnect layers. The front-end-of-line processes may include the set of process steps that form the active devices, such as transistors, capacitors, and diodes. The front-end-of-line processes include ion implantation, anneals, oxidation, CVD (chemical vapor deposition) or ALD (atomic layer deposition), etching, CMP (chemical mechanical polishing), and epitaxy.

The middle-of-line processes may include the set of process steps that enable connection of the transistors to the back-end-of-line interconnects (e.g., M1 . . . M8). These steps include silicidation and contact formation as well as stress introduction. The back-end-of-line processes may include the set of process steps that form the interconnect that ties the independent transistors and form circuits. Currently, copper and aluminum are used to form the interconnects using various process technology such as sputtering, spraying, and plating, but with further development of the technology, other conductive materials may be used.

According to aspects of the present disclosure, a duplexer may be arranged in a power amplifier (PA) integrated duplexer (PAMID) module or a front-end module with integrated duplexer (FEMID) module, in which the duplexer is integrated with a laminate substrate inductor, such as a laminate integrated inductor. The use of laminate integrated inductors may replace the use of surface mount devices within RF front-end modules due to spacing constraints. Unfortunately, the area occupied by the laminate integrated inductors within a substrate (e.g., a package substrate) may also be constrained due to customer specifications. For example, the substrate generally includes ground planes to meet isolation specifications to avoid interference between the laminate integrated inductors and the duplexers. Unfortunately, the ground planes of the substrate may compress a magnetic field of the laminate integrated inductors, which reduces the quality (Q)-factor when the laminate integrated inductors are arranged within a laminate substrate.

Aspects of the present disclosure describe a stepped-width, co-spiral inductor structure for high quality (Q)-factor radio frequency (RF) applications. In one arrangement, the stepped-width, co-spiral inductor structure includes a first exterior layer (e.g., a first exterior spiral inductor) having a width. In addition, the inductor structure includes a first interior layer (e.g., a first interior spiral inductor) coupled to the first exterior layer. In this arrangement, the first interior layer has a width that is wider than the width of the first exterior layer. The inductor structure also includes a second exterior layer (e.g., a second exterior spiral inductor) coupled to the first interior layer. In this arrangement, the second exterior layer has a width that is narrower than the width of the first interior layer. The width of the second exterior layer may be the same as the width of the first exterior layer. In an alternative arrangement, the width of the second exterior layer is greater than or less than the width of the first exterior layer.

In contrast to conventional inductors, which specify a co-spiral inductor with inductor traces having a fixed width, the improved inductor design is a stepped-width, co-spiral inductor structure with narrower trace widths near top and bottom ground planes to reduce inductor area and improve a quality (Q)-factor of the inductor structure. The inductor may be a laminate substrate inductor, in which the substrate supports a duplexer. The improved stepped-width, co-spiral inductor structure may exhibit a significant quality (Q)-factor improvement (e.g., 8.25% at 800 MHz). The improved stepped-width, co-spiral inductor structure also occupies a reduced area (e.g., 29% reduction) and has an improved duplexer insertion loss (e.g., 0.05 dB).

One goal driving the wireless communication industry is providing consumers with increased bandwidth. The use of carrier aggregation in current generation communications provides one possible solution for achieving this goal. For wireless communication, passive devices are used to process signals in carrier aggregation systems. In these carrier aggregation systems, signals are communicated with both high band and low band frequencies. In a radio frequency front-end (RFFE) module, a power amplifier (PA) may be integrated with a passive device (e.g., a duplexer) to provide a PAMID module. In addition, a front-end module may be integrated with a duplexer to provide a FEMID module. A duplexer (e.g., an acoustic filter) may be configured for simultaneous transmission and reception within the same band (e.g., a low band) to support carrier aggregation.

FIG. 1 is a schematic diagram of a radio frequency (RF) communications system 100 including a stepped-width, co-spiral inductor structure integrated with a duplexer 180 according to an aspect of the present disclosure. Representatively, the RF communications system 100 includes a WiFi module 170 having a first diplexer 190-1 and an RF front-end module 150 including a second diplexer 190-2 for a chipset 160 to provide carrier aggregation according to an aspect of the present disclosure. The WiFi module 170 includes the first diplexer 190-1 communicably coupling an antenna 192 to a wireless local area network module (e.g., WLAN module 172). The RF front-end module 150 includes the second diplexer 190-2 communicably coupling an antenna 194 to a wireless transceiver (WTR) 120 through the duplexer 180. The wireless transceiver 120 and the WLAN module 172 of the WiFi module 170 are coupled to a modem (mobile station modem (MSM), e.g., baseband modem) 130 that is powered by a power supply 152 through a power management integrated circuit (PMIC) 156.

The chipset 160 also includes capacitors 162 and 164, as well as an inductor(s) 166 to provide signal integrity. The PMIC 156, the modem 130, the wireless transceiver 120, and the WLAN module 172 each include capacitors (e.g., 158, 132, 122, and 174) and operate according to a clock 154. The geometry and arrangement of the various inductor and capacitor components in the chipset 160 may reduce the electromagnetic coupling between the components. The RF communications system 100 may also include a power amplifier (PA) integrated with the duplexer 180 (e.g., a PAMID module). The duplexer 180 may filter the input/output signals according to a variety of different parameters, including frequency, insertion loss, rejection or other like parameters. According to aspects of the present disclosure, the duplexer 180 may be integrated with a stepped-width, co-spiral inductor structure, for example, as shown in FIGS. 3A to 6.

Figure 2A:
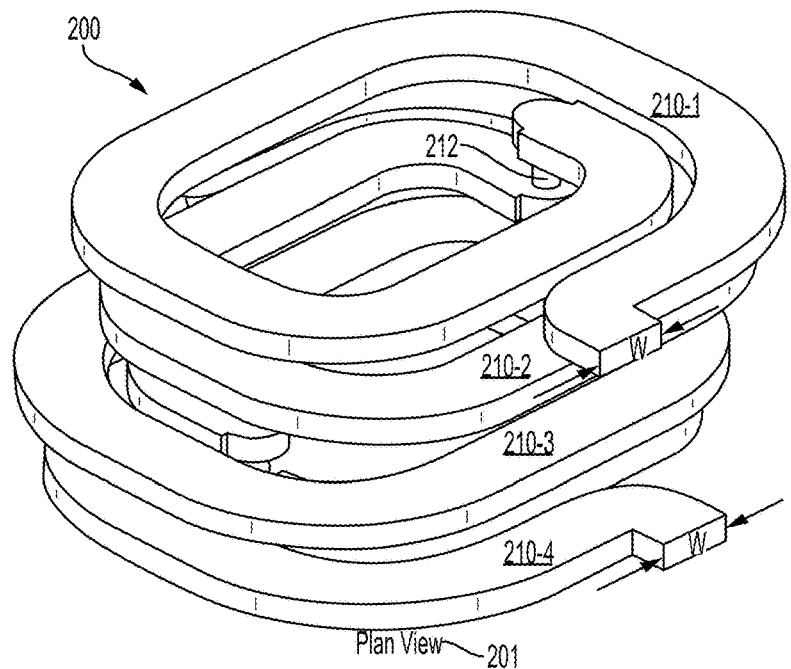
FIG. 2A shows a perspective of a laminate inductor structure and FIG. 2B shows a cross-section view of the laminate inductor structure in a substrate.
Figure 2B:
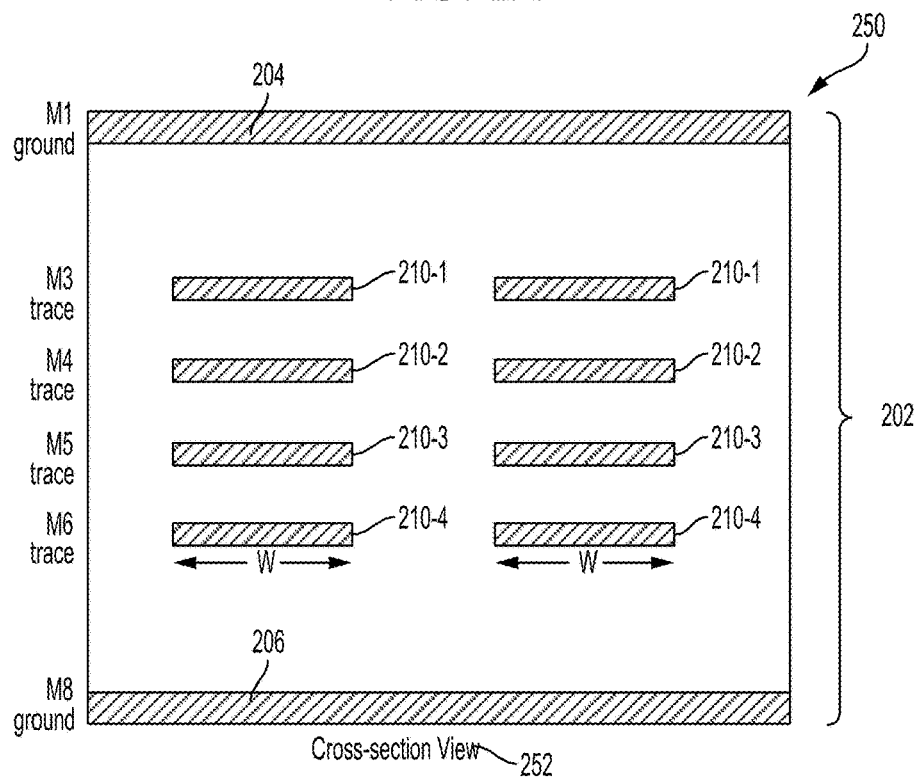

FIG. 2A shows a plan view 201 of an inductor structure 200 and FIG. 2B shows a cross-section view 252 of a laminate inductor structure 250 arranged in a substrate 202. Representatively, the inductor structure 200 is composed of a first trace 210-1, a second trace 210-2, a third trace 210-3, and a fourth trace 210-4, each having a fixed width W. The first trace 210-1, the second trace 210-2, the third trace 210-3, and the fourth trace 210-4 are arranged in overlapping spiral patterns coupled at a trace beginning/end of the inductor structure 200 using a via 212. The inductor structure 200 is arranged according to a multi-turn configuration. The inductor structure 200 may be within a substrate, for example, as shown in FIG. 2B.

FIG. 2B shows the cross-section view 252 of the laminate inductor structure 250 within the substrate 202 according to aspects of the present disclosure. Representatively, the inductor structure 200 of FIG. 2A is within a substrate 202 including a first ground plane 204 and a second ground plane 206 to form the laminate inductor structure 250. The first ground plane 204 may be formed from a first interconnect layer M1, and the second ground plane 206 may be formed from an eighth interconnect layer M8. The first ground plane 204 and the second ground plane 206 are generally arranged to meet inter-module shielding specifications within, for example, an RF front-end module.

The substrate 202 may be a package substrate, an interposer, a laminate substrate, a passive substrate, or other like substrate. The first trace 210-1 may be fabricated using a third interconnect layer M3, and the second trace 210-2 may be fabricated using a fourth interconnect layer M4. In addition, the third trace 210-3 may be fabricated using a fifth interconnect layer M5, and the fourth trace 210-4 may be fabricated using a sixth interconnect layer M6. In this arrangement, each of the inductive traces (e.g., 210) has a fixed width W and the substrate does not include a second interconnect layer M2 or a seventh interconnect layer M7.

According to aspects of the present disclosure, a duplexer may be arranged in a power amplifier (PA) integrated duplexer (PAMID) module or a front-end module with integrated duplexer (FEMID) module, in which the duplexer is integrated with a laminate substrate inductor, such as the laminate inductor structure 250. The use of laminate integrated inductors may replace the use of surface mount devices within, for example, the RF front-end module 150 (FIG. 1) due to spacing constraints. Unfortunately, the area occupied by the laminate inductor structure 250 within the substrate 202 is also constrained due to customer specifications. For example, the substrate 202 includes the first ground plane 204 and the second ground plane 206 to meet isolation specifications to avoid interference between the laminate integrated inductors and the duplexers. The first ground plane 204 and the second ground plane 206 of the substrate 202 may compress a magnetic field of the laminate inductor structure 250, which reduces the quality (Q)-factor when the laminate inductor structure is arranged as shown in FIGS. 2A and 2B.

Figure 3A:
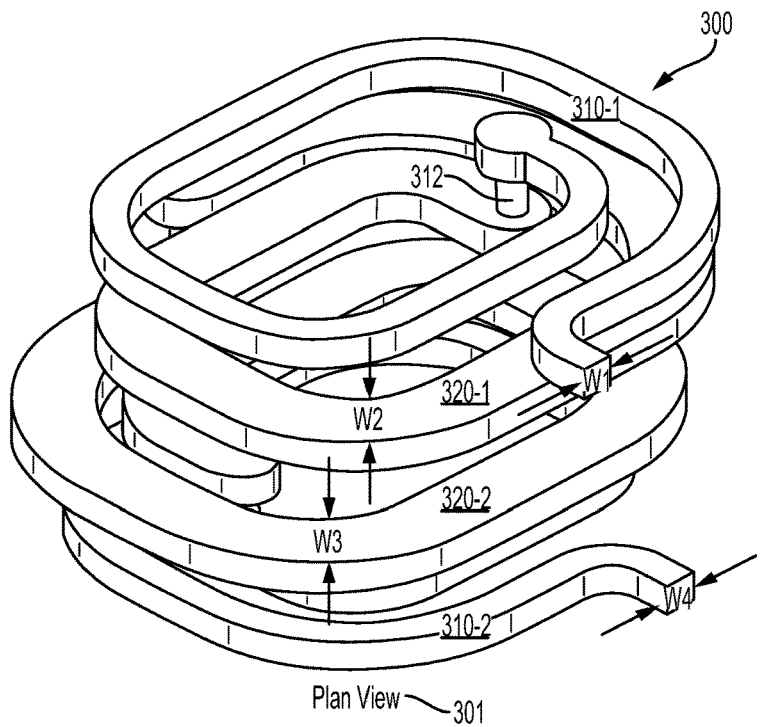
FIG. 3A shows a perspective of a stepped-width, co-spiral inductor structure according to aspects of the present disclosure.
Figure 3B:
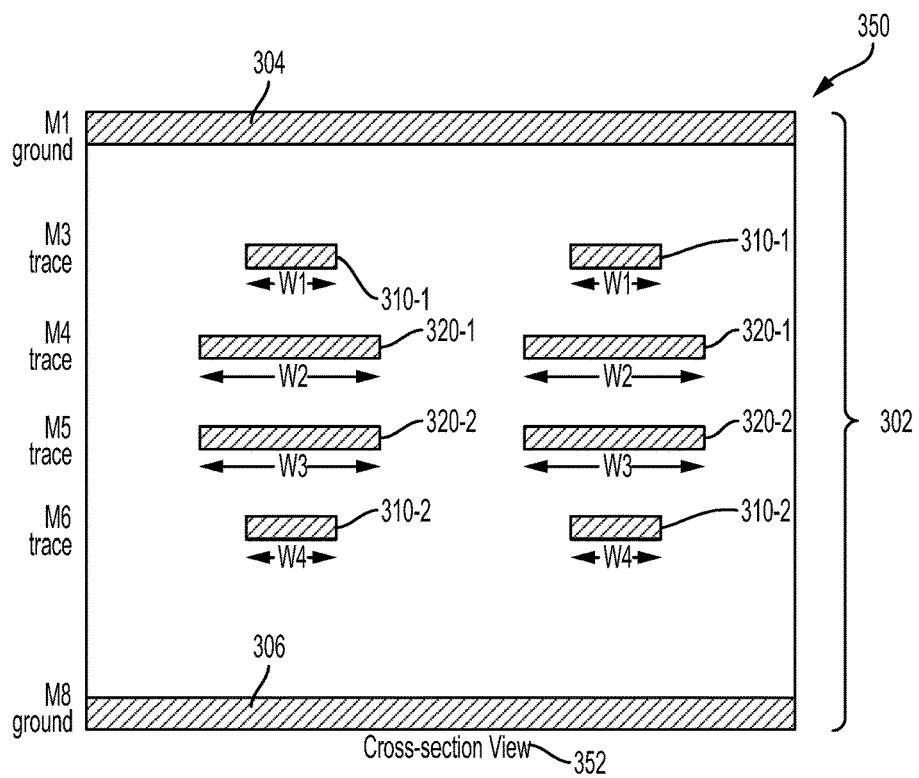
FIG. 3B shows a cross-section view of the stepped-width, co-spiral inductor structure of FIG. 3A arranged as a laminate inductor structure according to aspects of the present disclosure.

FIG. 3A shows a plan view 301 of a stepped-width, co-spiral inductor structure, and FIG. 3B shows a cross-section view of the stepped-width, co-spiral inductor of FIG. 3A, arranged as a laminate inductor structure according to aspects of the present disclosure. In contrast to the inductor structure 200 shown in FIG. 2A, which specifies a co-spiral inductor with inductor traces having a fixed width, FIG. 3A illustrates the plan view 301 of a stepped-width, co-spiral inductor structure 300 having narrower trace widths proximate top and bottom ground planes to reduce inductor area and improve a quality (Q)-factor of the inductor structure, according to aspects of the present disclosure.

Representatively, the stepped-width, co-spiral inductor structure 300 includes a first exterior trace 310-1 (e.g., a first exterior layer) and a second exterior trace 310-2 (e.g., a second exterior layer). The first exterior trace 310-1 has a first exterior trace width W1 (e.g., a first exterior width), and the second exterior trace 310-2 has a second exterior trace width W4 (e.g., a second exterior width), which may or may not equal the first exterior trace width W1. The stepped-width, co-spiral inductor structure 300 also includes a first interior trace 320-1 (e.g., a first interior layer) and a second interior trace 320-2 (e.g., a second interior layer). The first exterior trace 310-1, the first interior trace 320-1, the second interior trace 320-2, and the second exterior trace 310-2 are arranged in overlapping spiral patterns coupled at a trace beginning/end of the stepped-width, co-spiral inductor structure 300 using a via 312. The stepped-width, co-spiral inductor structure 300 is arranged according to a multi-turn configuration.

The first interior trace 320-1 has a first interior trace width W2 (e.g., a first interior width), and the second interior trace 320-2 has a second interior trace width W3 (e.g., a second interior width). The first interior trace width W2 equals the second interior trace width W3; however, the second interior trace width W3 may be different from the first interior trace width W2. In this aspect of the present disclosure, the first interior trace width W2 and the second interior trace width W3 are each greater than the first exterior trace W1 and the second exterior trace width W4. In this arrangement, the first exterior trace width W1 equals the second exterior trace width W4; however, the second exterior trace width W4 may be different from the first exterior trace width W1. The stepped-width, co-spiral inductor structure 300 may be within a substrate, for example, as shown in FIG. 3B.

FIG. 3B shows a cross-section view 352 of the stepped-width, co-spiral inductor structure 300 of FIG. 3A, arranged as a stepped-width, laminate inductor structure 350 according to aspects of the present disclosure. Representatively, the stepped-width, co-spiral inductor structure 300 of FIG. 3A is within a substrate 302, including a first ground plane 304 and a second ground plane 306 to form the stepped-width, laminate inductor structure 350. The first ground plane 304 is also formed from a first interconnect layer M1, and the second ground plane 306 is also formed from an eighth interconnect layer M8. The first ground plane 304 and the second ground plane 306 are arranged to meet inter-module shielding specifications within, for example, the RF front-end module 150 shown in FIG. 1.

The substrate 302 may be a package substrate, an interposer, a laminate substrate, a passive substrate, or other like substrate. The first exterior trace 310-1 may be fabricated using a third interconnect layer M3, and the second exterior trace 310-2 may be fabricated using a sixth interconnect layer M6. In addition, the first interior trace 320-1 may be fabricated using a fourth interconnect layer M4, and the second interior trace 320-2 may be fabricated using a fifth interconnect layer M5. In this arrangement, the first interior trace width W2 equals the second interior trace width W3, and the first exterior trace width W1 equals the second exterior trace width W4. In addition, the substrate 302 does not include a second interconnect layer M2 or a seventh interconnect layer M7.

Figure 6:
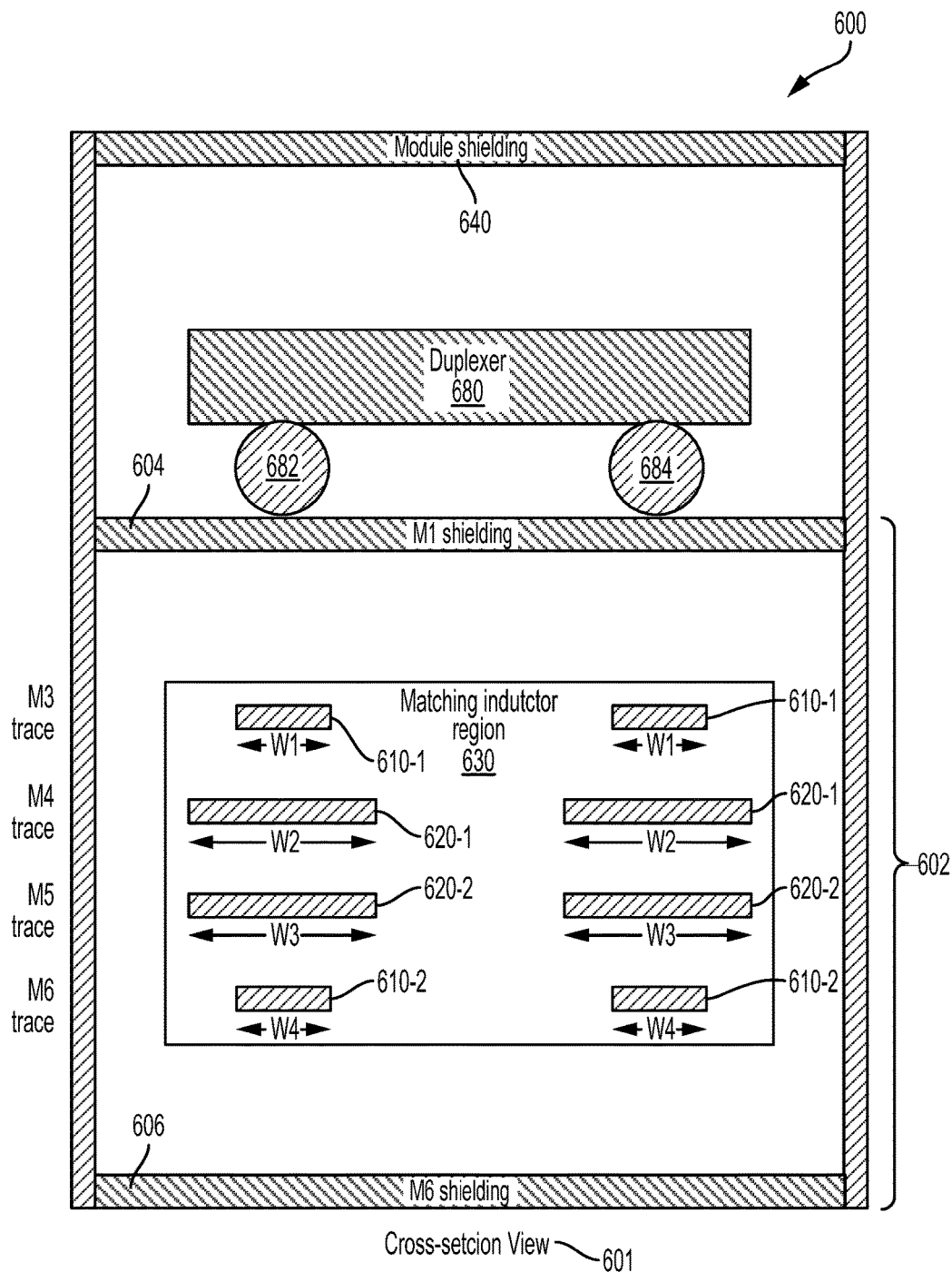
FIG. 6 is a cross-section view of a duplexer arranged in a power amplifier (PA) integrated duplexer (PAMID) module or a front-end module with integrated duplexer (FEMID) module including a stepped-width, laminate inductor structure, according to aspects of the present disclosure.

The stepped-width, laminate inductor structure 350 may support a duplexer on the substrate 302, for example, as shown in FIG. 6. The improved stepped-width, co-spiral inductor structure may exhibit a significant quality (Q)-factor improvement (e.g., 8.25% at 800 MHz) by having narrower trace widths proximate top and bottom ground planes of a substrate. For example, a stepped-width, co-spiral inductor structure 300 may exhibit a quality (Q)-factor of 21 at 800 MHz, compared to a factor of 19 at 800 MHz exhibited by the inductor structure 200 of FIG. 2A. The stepped-width, co-spiral inductor structure 300 also occupies a reduced area (e.g., 29% reduction) and has an improved insertion loss (e.g., 0.05 dB), when arranged as shown in FIG. 3B.

Figure 4A:
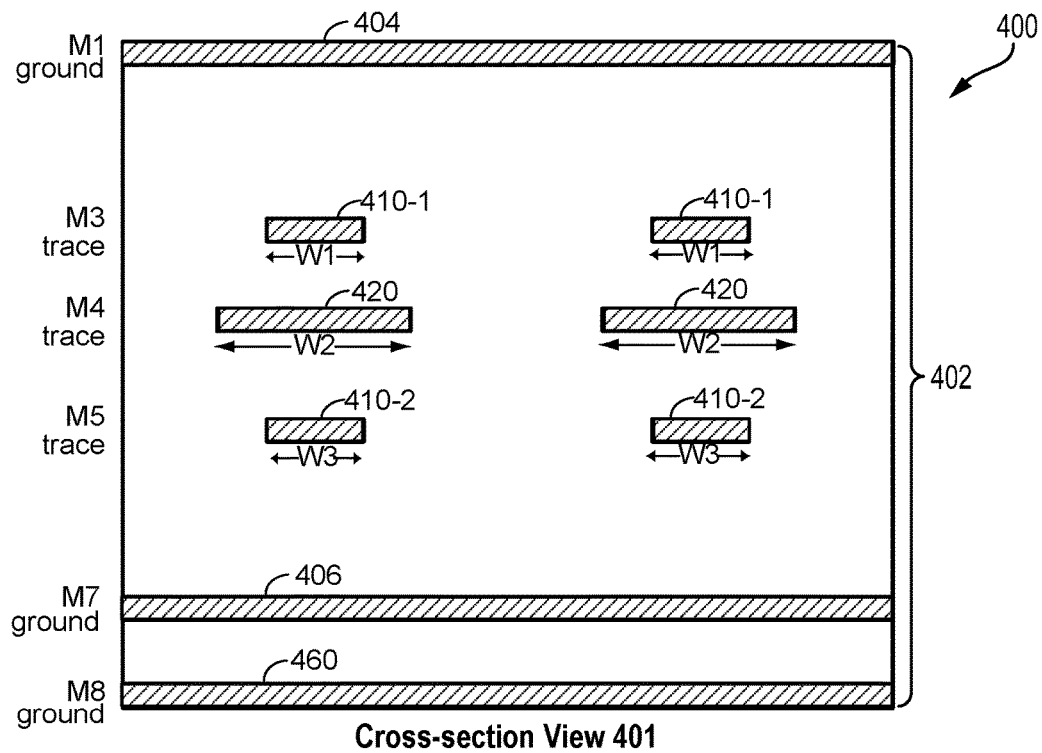
FIGS. 4A and 4B show cross-section views of stepped-width, laminate inductor structures according to aspects of the present disclosure.

FIG. 4A shows a cross-section view 401 of a stepped-width, laminate inductor structure 400 according to aspects of the present disclosure. Representatively, the stepped-width, laminate inductor structure 400 includes a substrate 402 having a first ground plane 404 and a second ground plane 406 to shield inter-module RF components from the magnetic fields of the laminate inductor structure 400. The first ground plane 404 is formed from a first interconnect layer M1, and the second ground plane 406 is formed from a seventh interconnect layer M7. In this arrangement, however, an interconnect layer 460 (e.g., the eighth interconnect layer M8) may be used to communicate a digital signal.

In this aspect of the present disclosure, the use of the interconnect layer 460 for communicating a digital signal reduces the inductor area available between the first ground plane 404 and the second ground plane 406. The first ground plane 404 and the second ground plane 406 are arranged to meet inter-module shielding specifications within, for example, the RF front-end module 150 shown in FIG. 1. The substrate 402 may be a package substrate, an interposer, a laminate substrate, a passive substrate, or other like substrate. This arrangement, therefore, reduces the available area for formation of an inductor structure. To meet the reduced area specification, the stepped-width, laminate inductor structure 400 includes an interior trace 420, rather than the multiple interior traces of the stepped-width, laminate inductor structure 350 shown in FIG. 3B.

In this aspect of the present disclosure, the stepped-width, laminate inductor structure 400 includes a first exterior trace 410-1 fabricated using a third interconnect layer M3, and a second exterior trace 410-2 fabricated using a fifth interconnect layer M5. In addition, the interior trace 420 may be fabricated using a fourth interconnect layer M4. A first exterior trace width W1 of the first exterior trace 410-1 equals a second exterior trace width W3 of the second exterior trace 410-2, which are both less than an interior trace width W2 of the interior trace 420. Although the substrate 402 does not include a second interconnect layer M2 or a sixth interconnect layer M6, the addition of the interconnect layer 460 increases compression of the magnetic field produced by the stepped-width, laminate inductor structure 400. As noted, the additional compression is compensated for by removing the second interior trace 320-2 (FIG. 3B) from the stepped-width, laminate inductor structure 400.

Figure 4B:
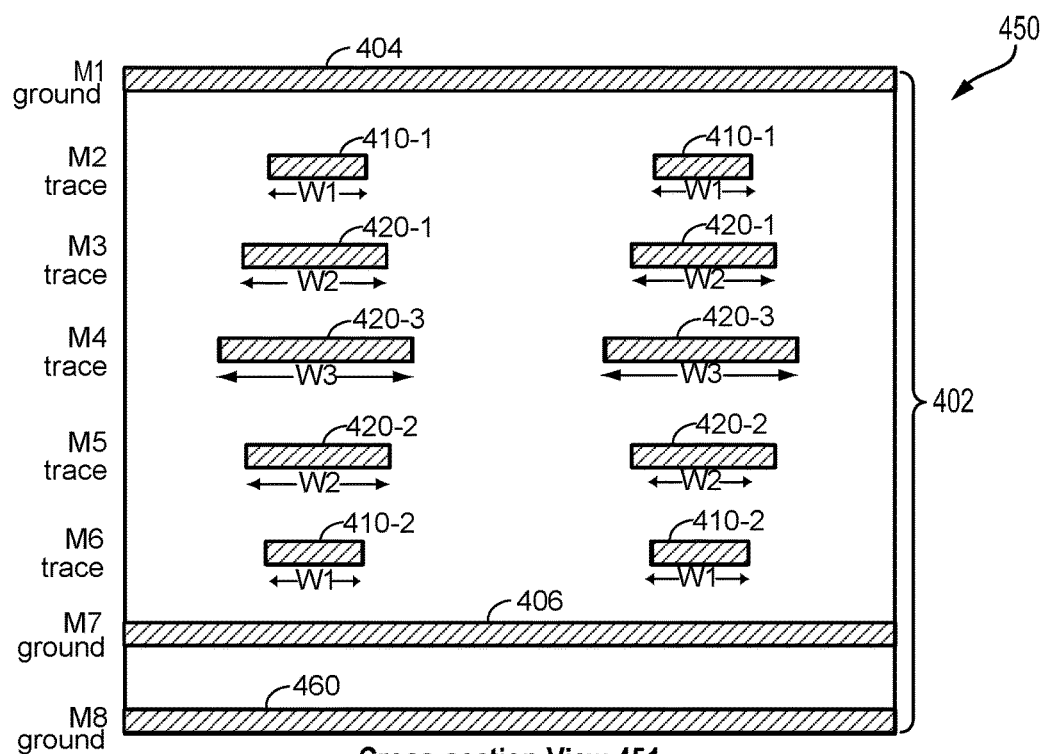

FIG. 4B shows a cross-section view 451 of a stepped-width, laminate inductor structure 450 according to aspects of the present disclosure. As will be recognized, a configuration of the stepped-width, laminate inductor structure 450 is similar to the configuration of the stepped-width, laminate inductor structure 400 of FIG. 4A. In the configuration shown in FIG. 4B, however, the first exterior trace 410-1 is fabricated using a second interconnect layer M2, and the second exterior trace 410-2 is fabricated using a sixth interconnect layer M6. In addition, a first interior trace 420-1 is fabricated using a third interconnect layer M3, and a second interior trace 420-2 is fabricated using a fifth interconnect layer M5. A third interior trace 420-3 (e.g., a third interior layer), fabricated using a fourth interconnect layer M4, is between the first interior trace 420-1 and the second interior trace 420-2.

The first exterior trace 410-1 and the second exterior trace 410-2 each have the same first exterior trace width W1. Similarly, the first interior trace 420-1 and the second interior trace 420-2 each have the same second interior trace width W2, which is greater than the first exterior trace width W1 of the first exterior trace 410-1 and the second exterior trace 410-2. In addition, a third interior trace width W3 (e.g., a third interior width) of the third interior trace 420-3 is greater than the second interior trace width W2 of the first interior trace 420-1 and the second interior trace 420-2.

Additional compression due to the third interior trace 420-3 is compensated for by further reducing the trace width (W1) of the first exterior trace 410-1 and the second exterior trace 410-2 as well as the trace width (W2) the first interior trace 420-1 and the second interior trace 420-2 to form the stepped-width, laminate inductor structure 450.

Figure 5:
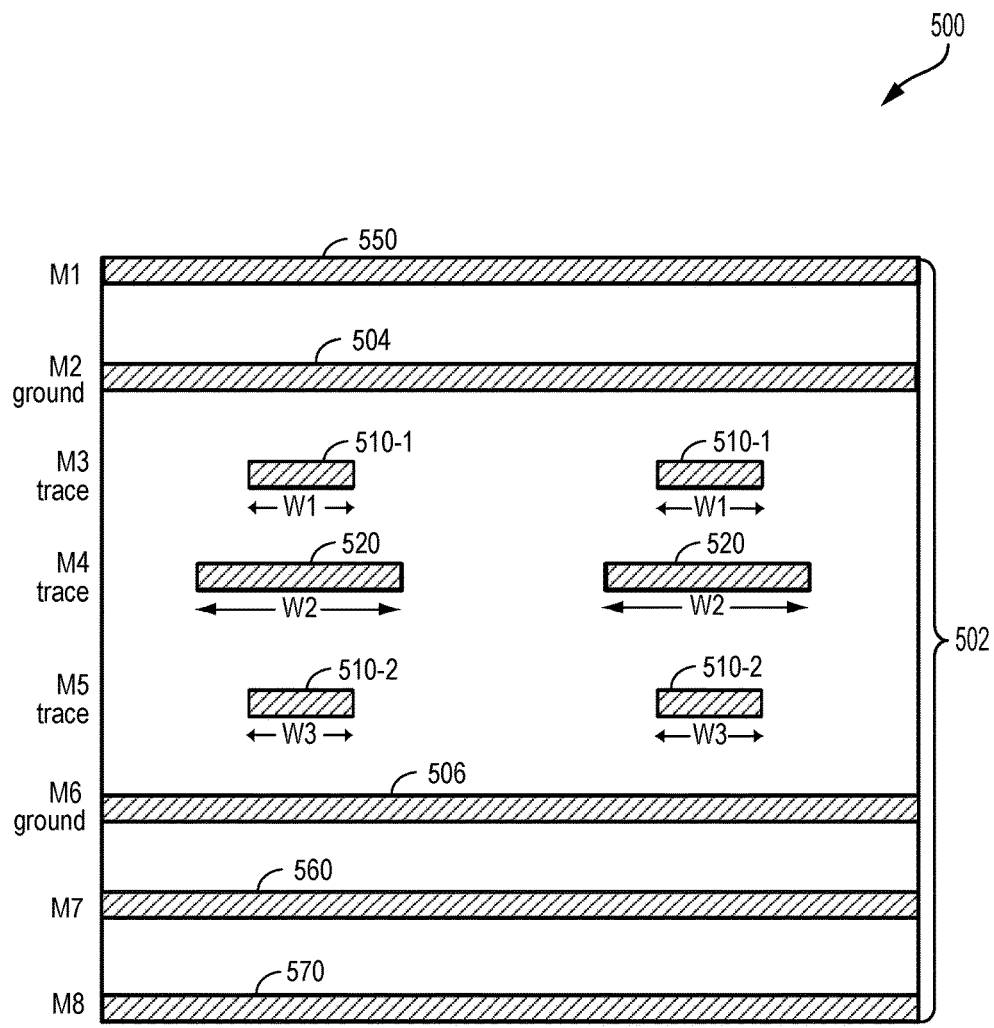
FIG. 5 shows a cross-section view of a stepped-width, laminate inductor structure according to further aspects of the present disclosure.

FIG. 5 shows a cross-section view 501 of a stepped-width, laminate inductor structure 500 according to aspects of the present disclosure. Representatively, the stepped-width, laminate inductor structure 500 includes a substrate 502, having a first ground plane 504 and a second ground plane 506 to shield inter-module RF components from the magnetic fields of the stepped-width, laminate inductor structure 500. In this arrangement, however, the first ground plane 504 is formed from a second interconnect layer M2, and the second ground plane 506 is formed from a sixth interconnect layer M6. In this aspect of the present disclosure, a first interconnect layer 550 (e.g., the first interconnect layer M1) may be used to communicate a signal. In addition, a second interconnect layer 560 (e.g., the seventh interconnect layer M7) and a third interconnect layer 570 (e.g., the eighth interconnect layer M8) may be used to provide signal communication or other like function rather than operating as a ground layer.

In this aspect of the present disclosure, the use of the first interconnect layer 550, the second interconnect layer 560, and the third interconnect layer 570 for signal communication (e.g., digital signal communication) reduces the inductor area available between the first ground plane 504 and the second ground plane 506, which are arranged to meet inter-module shielding specifications within, for example, the RF front-end module 150 shown in FIG. 1. This arrangement, therefore, further reduces the available area for formation of an inductor structure. To meet the reduced area specification, the stepped-width, laminate inductor structure 500 includes an interior trace 520, rather than the multiple interior traces of the stepped-width, laminate inductor structure 350 shown in FIG. 3B.

In this aspect of the present disclosure, the stepped-width, laminate inductor structure 500 includes a first exterior trace 510-1 fabricated using the third interconnect layer M3, and a second exterior trace 510-2 fabricated using the fifth interconnect layer M5. In addition, the interior trace 520 may be fabricated using the fourth interconnect layer M4. In this arrangement, the first exterior trace width W1 of the first exterior trace 510-1 equals the second exterior trace width W3 of the second exterior trace 510-2, which are both less than an interior trace width W2 of the interior trace 520. The addition of the first interconnect layer 550, the second interconnect layer 560, and the third interconnect layer 570 further increases compression of the magnetic field produced by the stepped-width, laminate inductor structure 500. According to aspects of the present disclosure, the additional compression is compensated for by removing the second interior trace 320-2 (FIG. 3B) and further adjusting the trace width of the stepped-width, laminate inductor structure 500.

FIG. 6 is a cross-section view 601 of a duplexer 680 arranged in a power amplifier (PA) integrated duplexer (PAMID) module or a front-end module with integrated duplexer (FEMID) module 600 including a stepped-width, laminate inductor structure, according to aspects of the present disclosure. In this arrangement, the duplexer 680 is supported by a stepped-width, laminate inductor structure, such as the laminate inductor structure 350, as shown in FIG. 3B. The use of laminate integrated inductors may replace the use of surface mount devices within, for example, the RF front-end module 150 (FIG. 1) due to spacing constraints. In particular, the area occupied by the laminate inductor structure within a substrate 602 is constrained due to customer specifications. For example, the substrate 602 includes a first ground plane 604 and a second ground plane 606 to meet isolation specifications to avoid interference between the laminate inductor structure within a matching inductor region 630 and the duplexer 680. Unfortunately, the first ground plane 604 and the second ground plane 606 of the substrate 602 may compress a magnetic field of the laminate inductor structure, which reduces the quality (Q)-factor when the laminate inductor structure is arranged within the matching inductor region 630.

In this aspect of the present disclosure, the matching inductor region 630 includes a stepped-width, laminate inductor structure within the substrate 602. The substrate 602 includes a first exterior trace 610-1 fabricated using the second interconnect layer M2, and a second exterior trace 610-2 fabricated using the fifth interconnect layer M5. The substrate 602 also includes a first interior trace 620-1 and a second interior trace 620-2. The first interior trace 620-1 may be fabricated using the third interconnect layer M3, and the second interior trace 620-2 may be fabricated using the fourth interconnect layer M4. In this arrangement, a first exterior trace width W1 of the first exterior trace 610-1 equals a second exterior trace width W4 of the second exterior trace 610-2, which are both less than a first interior trace width W2 of the first interior trace 620-1 and a second interior trace width W3 of the second interior trace 620-2.

The PAMID/FEMID module 600 also includes the duplexer 680 supported by the substrate 602. The duplexer 680 is coupled to the first ground plane 604 through conductive bumps 682 and 684 (e.g., solder balls). The PAMID/FEMID module 600 also includes a module shielding layer 640 surrounding the duplexer 680 and the substrate 602. In addition, the PAMID/FEMID module 600 may be supported by a system board (not shown), such as a printed circuit board (PCB), a system board, or other like board. The stepped-width, laminate inductor structure in the matching inductor region 630 of the PAMID/FEMID module 600 may exhibit a significant quality (Q)-factor improvement by having a narrower trace widths proximate top and bottom ground planes of the substrate 602.

Furthermore, the PAMID/FEMID module may show improved insertion loss in the pass band, leading to many benefits in PA efficiency, power saving, etc. According to aspects of the present disclosure, the area occupied by the stepped-width, laminate inductor structure may be reduced (e.g., 29% reduction). The reduced area occupied by the stepped-width, laminate inductor structure in the matching inductor region 630 prevents the first ground plane 604 and the second ground plane 606 of the substrate 602 from compressing the magnetic field of the laminate integrated inductor. As a result the quality (Q)-factor of the laminate integrated inductor is not degraded. In addition, the duplexer may exhibit improved insertion loss (e.g., 0.05 dB), in a PAMID/FEMID module 600 as shown in FIG. 6.

Figure 7:
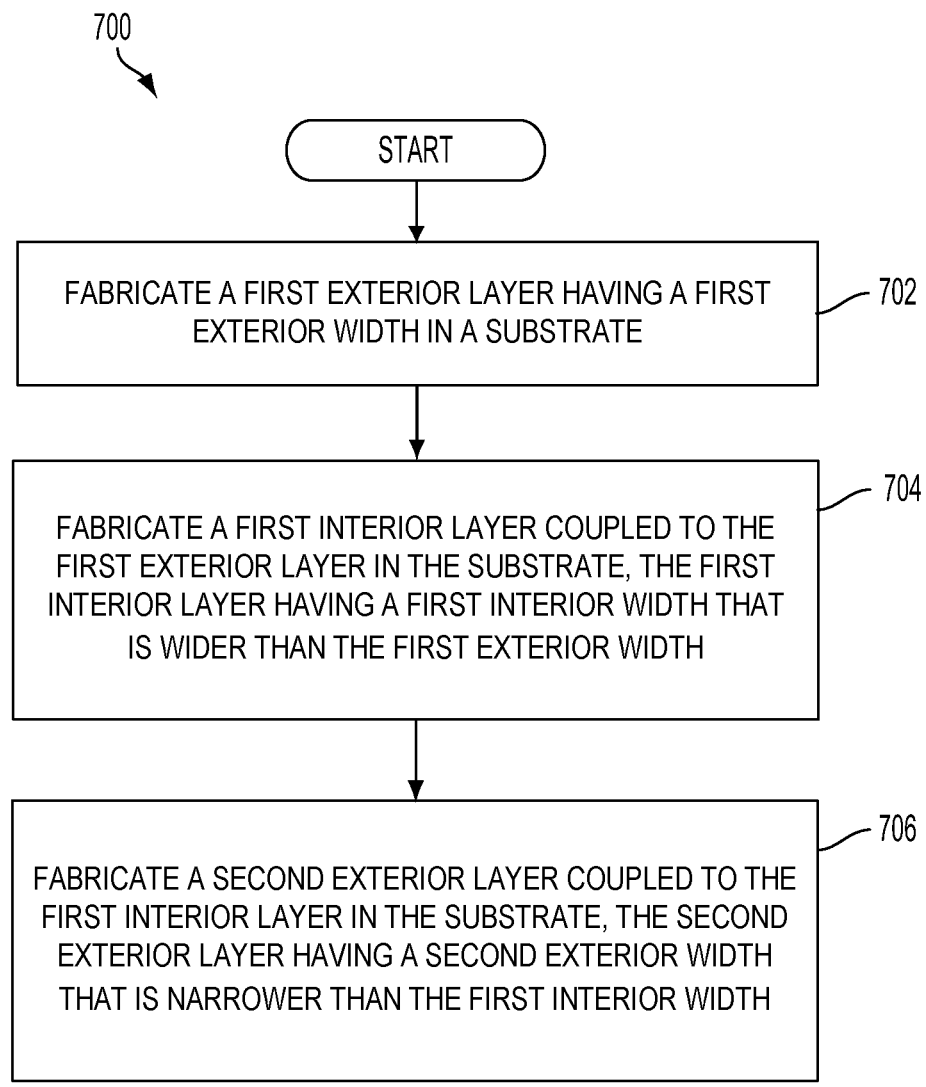
FIG. 7 is a flow diagram illustrating a method of fabricating a stepped-width, co-spiral inductor structure according to aspects of the disclosure.

FIG. 7 is a flow diagram illustrating a method 700 of fabricating a stepped-width, co-spiral inductor structure according to aspects of the present disclosure. At block 702, a first exterior layer having a first exterior width is fabricated in a substrate. For example, as shown in FIG. 3B, the first exterior trace 310-1 is fabricated in the substrate 302, proximate to a first ground plane 304 of a substrate 302. At block 704, a first interior layer coupled to the first exterior layer is fabricated in the substrate. The first interior layer may have a first interior width that is wider than the first exterior width. For example, as shown in FIG. 3B, the first interior trace 320-1 is fabricated in the substrate 302, proximate to the first exterior trace 310-1. The first interior width W2 of the first interior trace 320-1 can be wider than the first exterior width W1 of the first exterior trace 310-1.

Referring again to FIG. 7, at block 706, a second exterior layer coupled to the first interior layer is fabricated in the substrate. The second exterior layer may have a second exterior width that is narrower than the first interior width. For example, as shown in FIG. 3B, the second exterior trace 310-2 is fabricated in the substrate 302, proximate the second ground plane 306. The first interior width W2 of the first interior trace 320-1 can be wider than the second exterior width W4 of the second exterior trace 310-2. According to aspects of the present disclosure, the second exterior width W4 of the second exterior trace 310-2 may be equal to or different from the first exterior width W1 of the first exterior trace 310-1.

Fabricating the first exterior layer in block 702 may include patterning the first exterior trace 310-1 by etching a conductive material in the substrate 302 according to a spiral pattern having the first exterior width W1, for example, as shown in FIGS. 3A and 3B. In addition, fabricating the first interior layer of block 704 may include etching a first via opening in a first separation layer to expose the first exterior trace 310-1. The first separation layer is then patterned according to a first interior spiral pattern having the first interior width W2. Next a conductive material is deposited in the first via opening and the patterned first separation layer. This process may also include etching the conductive material in the patterned first separation layer as a first interior spiral inductor coupled to the first exterior layer through the first via opening.

According to aspects of the present disclosure, fabricating the second exterior layer of block 706 may include etching a second via opening in a second separation layer to expose the first interior trace 320-1. Next, the second separation layer is patterned according to a second exterior spiral pattern having the second exterior width W4. A conductive material is then deposited in the second via opening and the second patterned separation layer. This process may be completed by etching the conductive material in the patterned second separation layer as a second exterior spiral inductor coupled to the first interior spiral inductor through the second via opening, for example, as shown in FIG. 3A. As shown in FIG. 3B, the stepped-width, co-spiral inductor is within the substrate 302. The substrate 302 includes the first ground plane 304 proximate to a first exterior layer (e.g., the first exterior trace 310-1), and the second ground plane 306 proximate the second exterior layer (e.g., the second exterior trace 310-2), such that the first ground plane 304 is distal from the second ground plane 306.

The use of laminate integrated inductors may replace the use of surface mount devices within RF front-end modules due to spacing constraints. Unfortunately, the area occupied by the laminate integrated inductors within a substrate (e.g., a package substrate) may also be constrained due to customer specifications. In contrast to conventional inductors, with inductor traces having a fixed width, the improved inductor design is a stepped-width, co-spiral inductor structure with narrower trace widths proximate top and bottom ground planes to reduce inductor area and improve quality (Q)-factor of the inductor structure. According to aspects of the present disclosure, a duplexer may be arranged in a power amplifier (PA) integrated duplexer (PAMID) module or a front-end module with integrated duplexer (FEMID) module, in which the duplexer is integrated with a stepped-width, co-spiral inductor structure for high quality (Q)-factor radio frequency (RF) applications.

Figure 8:
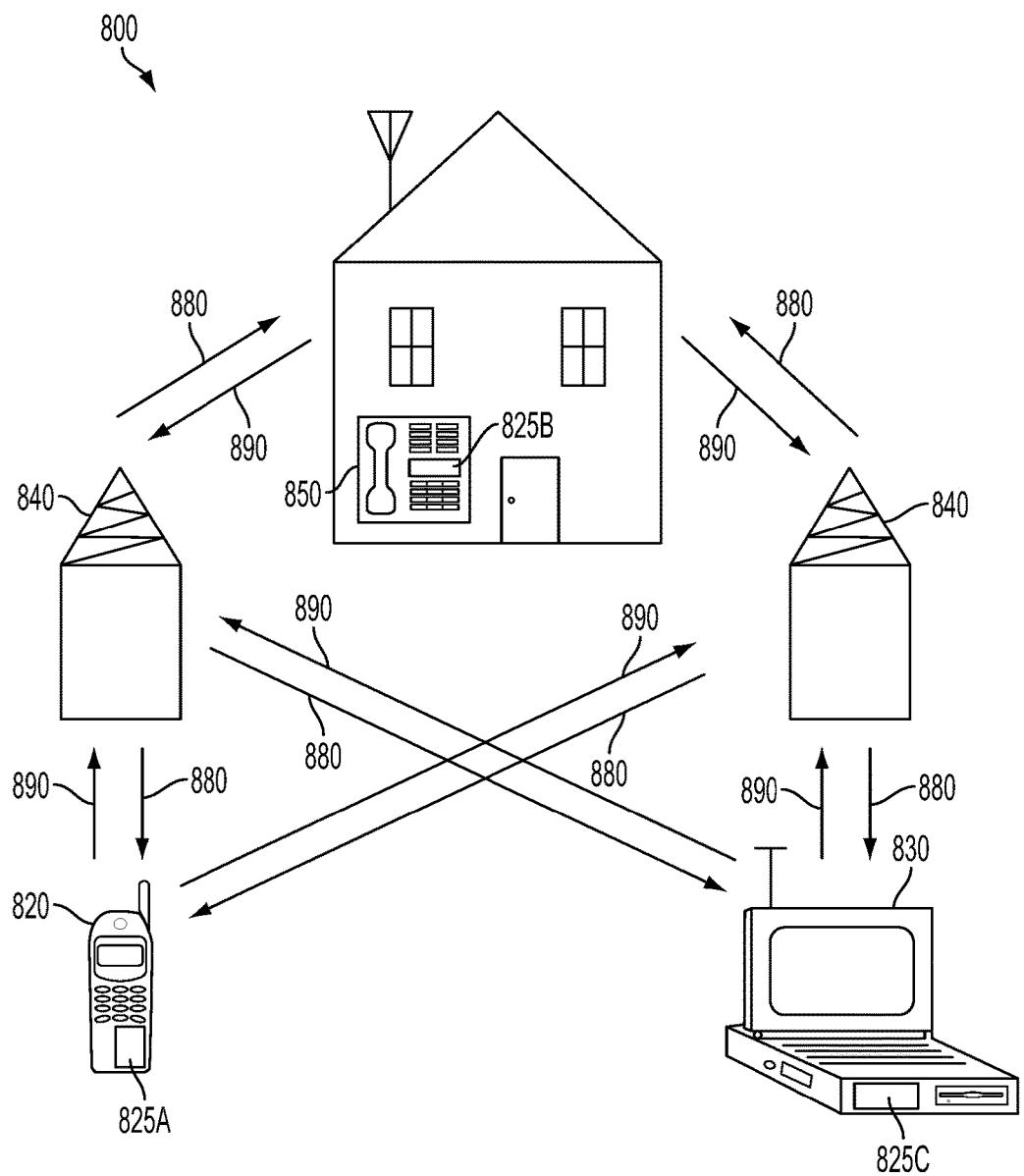
FIG. 8 is a block diagram showing an exemplary wireless communication system in which a configuration of the disclosure may be advantageously employed.

FIG. 8 is a block diagram showing an exemplary wireless communication system 800 in which an aspect of the disclosure may be advantageously employed. For purposes of illustration, FIG. 8 shows three of the remote units 820, 830, and 850 and two of the base stations 840. It will be recognized that wireless communication systems may have many more remote units and base stations. Remote units 820, 830, and 850 each include IC devices 825A, 825C, and 825B having a radio frequency (RF) front-end module that includes the disclosed inductors. It will be recognized that other devices may also include the disclosed inductors, such as the base stations, switching devices, and network equipment including a RF front-end module. FIG. 8 shows forward link signals 880 from one of the base stations 840 to the remote units 820, 830, and 850 and reverse link signals 890 from the remote units 820, 830, and 850 to base stations 840.

In FIG. 8, one of the remote units 820 is shown as a mobile telephone, one of the remote units 830 is shown as a portable computer, and remote unit 850 is shown as a fixed location remote unit in a wireless local loop system. For example, the remote units 820, 830, and 850 may be a mobile phone, a hand-held personal communication systems (PCS) unit, a portable data unit such as a personal digital assistant (PDA), a GPS enabled device, a navigation device, a set top box, a music player, a video player, an entertainment unit, a fixed location data unit such as a meter reading equipment, or a communications device, including an RF front-end module, that stores or retrieves data or computer instructions, or combinations thereof. Although FIG. 8 illustrates remote units according to the aspects of the disclosure, the disclosure is not limited to these exemplary illustrated units. Aspects of the disclosure may be suitably employed in many devices, which include the disclosed devices.

Figure 9:
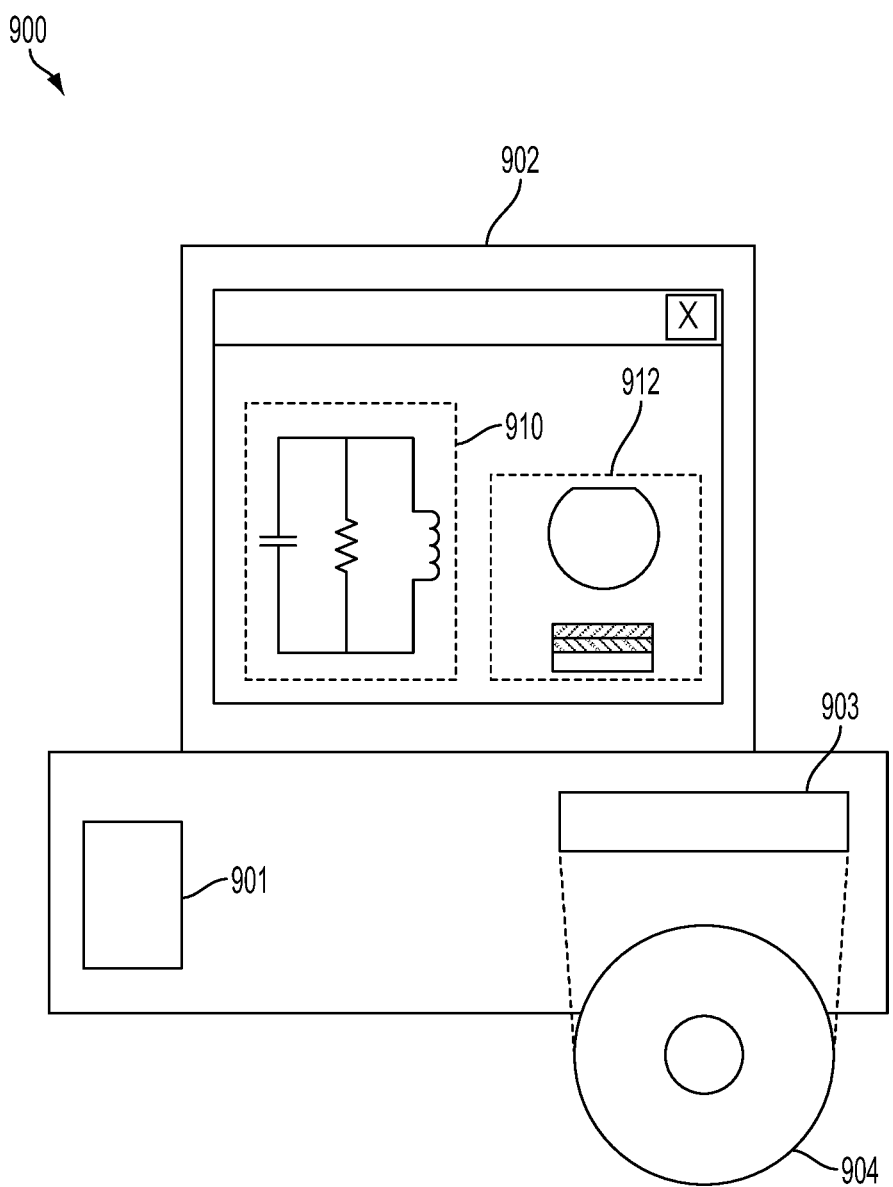
FIG. 9 is a block diagram illustrating a design workstation used for circuit, layout, and logic design of the stepped-width, co-spiral inductor structure according to aspects of the present disclosure.

FIG. 9 is a block diagram illustrating a design workstation used for circuit, layout, and logic design of the stepped-width, co-spiral inductor structure disclosed above. A design workstation 900 includes a hard disk 901 containing operating system software, support files, and design software such as Cadence or OrCAD. The design workstation 900 also includes a display 902 to facilitate design of a circuit 910 or a stepped-width, co-spiral inductor structure 912. A storage medium 904 is provided for tangibly storing the design of the circuit 910 or the stepped-width, co-spiral inductor structure 912. The design of the circuit 910 or the stepped-width, co-spiral inductor structure 912 may be stored on the storage medium 904 in a file format such as GDSII or GERBER. The storage medium 904 may be a CD-ROM, DVD, hard disk, flash memory, or other appropriate device. Furthermore, the design workstation 900 includes a drive apparatus 903 for accepting input from or writing output to the storage medium 904.

Data recorded on the storage medium 904 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 904 facilitates the design of the circuit 910 or the stepped-width, co-spiral inductor structure 912 by decreasing the number of processes for designing semiconductor or passive wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD) and Blu-ray disc where disks usually reproduce data magnetically, while discs reproduce data optically with lasers. Combinations of the above should also be included within the scope of computer-readable media.

In addition to storage on computer-readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The steps of a method or algorithm described in connection with the disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can include RAM, ROM, EEPROM, CD-ROM or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD) and Blu-ray disc where disks usually reproduce data magnetically, while discs reproduce data optically with lasers. Combinations of the above should also be included within the scope of computer-readable media.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "a step for."

What is claimed is:

1. A stepped-width, co-spiral inductor structure, comprising:
    a first exterior layer having a first exterior width;
    a first interior layer coupled to the first exterior layer, the first interior layer having a first interior width that is wider than the first exterior width;
    a second exterior layer coupled to the first interior layer, the second exterior layer having a second exterior width that is narrower than the first interior width; and
    a second interior layer coupled to the first interior layer, the second interior layer having a second interior width that is wider than the first exterior width and the second exterior width, in which the second exterior layer is coupled to the first interior layer through the second interior layer, and the second interior width is different than the first interior width.

2. The stepped-width, co-spiral inductor structure of claim 1, in which the first exterior layer is near a first ground plane of a substrate.

3. The stepped-width, co-spiral inductor structure of claim 1, in which the second exterior layer is near a second ground plane of a substrate.

4. The stepped-width, co-spiral inductor structure of claim 1, in which the first exterior width is the same as the second exterior width.

5. The stepped-width, co-spiral inductor structure of claim 1, under an acoustic filter supported by a first ground plane of a substrate.

6. The stepped-width, co-spiral inductor structure of claim 1, within a package substrate including a first ground plane proximate the first exterior layer and a second ground plane proximate the second exterior layer.

7. The stepped-width, co-spiral inductor structure of claim 1, integrated into a radio frequency (RF) front-end module, the RF front-end module incorporated into at least one of a music player, a video player, an entertainment unit, a navigation device, a communications device, a personal digital assistant (PDA), a fixed location data unit, a mobile phone, and a portable computer.

8. A stepped-width, co-spiral inductor structure, comprising:
    a first exterior layer having a first exterior width;
    a first interior layer coupled to the first exterior layer, the first interior layer having a first interior width that is wider than the first exterior width;
    a second exterior layer coupled to the first interior layer, the second exterior layer having a second exterior width that is narrower than the first interior width;
    a second interior layer coupled to the first interior layer, the second interior layer having a second interior width that is wider than the first exterior width and the second exterior width, in which the second exterior layer is coupled to the first interior layer through the second interior layer; and a third interior layer coupled between the first interior layer and the second interior layer, the third interior layer having a third interior width that is wider than the first interior width and the second interior width, in which the second interior width equals the first interior width.

9. A method of fabricating a stepped-width, co-spiral inductor structure, comprising:

fabricating a first exterior layer having a first exterior width in a substrate by:
patterning the first exterior layer and etching a conductive material in the substrate according to a first exterior spiral pattern having the first exterior width as a first exterior spiral inductor;

fabricating a first interior layer coupled to the first exterior layer in the substrate, the first interior layer having a first interior width that is wider than the first exterior width by:
etching a first via opening in a first separation layer to expose the first exterior layer;
patterning the first separation layer according to a first interior spiral pattern having the first interior width;
depositing a conductive material in the first via opening and the patterned first separation layer; and
etching the conductive material in the patterned first separation layer as a first interior spiral inductor coupled to the first exterior layer through the first via opening; and fabricating a second exterior layer coupled to the first interior layer in the substrate, the second exterior layer having a second exterior width that is narrower than the first interior width.

10. The method of claim 9, in which fabricating the second exterior layer comprises:
etching a second via opening in a second separation layer to expose the first interior spiral inductor;
patterning the second separation layer according to a second exterior spiral pattern having the second exterior width;
depositing the conductive material in the second via opening and the second patterned separation layer; and
etching the conductive material in the patterned second separation layer as a second exterior spiral inductor coupled to the first interior spiral inductor through the second via opening.

11. The method of claim 9, further comprising:
integrating the stepped-width, co-spiral inductor structure into a radio frequency (RF) front-end module; and
incorporating the RF front-end module into at least one of a music player, a video player, an entertainment unit, a navigation device, a communications device, a personal digital assistant (PDA), a fixed location data unit, a mobile phone, and a portable computer.

12. A radio frequency (RF) front-end module, comprising:
a stepped-width, laminate inductor structure, comprising a stepped-width, co-spiral inductor structure in a substrate, the stepped-width, laminate inductor structure including a first exterior layer having a first exterior width, a first interior layer coupled to the first exterior layer, the first interior layer having a first interior width that is wider than the first exterior width, and a second exterior layer coupled to the first interior layer, the second exterior layer having a second exterior width that is narrower than the first interior width, in which the second exterior width is different than the first exterior width; and
a duplexer supported by the stepped-width, laminate inductor structure.

13. The RF front-end module of claim 12, further comprising a second interior layer coupled to the first interior layer, the second interior layer having a second interior width that is wider than the first exterior width and the second exterior width, in which the second exterior layer is coupled to the first interior layer through the second interior layer.

14. The RF front-end module of claim 13, in which the second interior width equals the first interior width.

15. The RF front-end module of claim 13, in which the second interior width is different than the first interior width.

16. The RF front-end module of claim 12, incorporated into at least one of a music player, a video player, an entertainment unit, a navigation device, a communications device, a personal digital assistant (PDA), a fixed location data unit, a mobile phone, and a portable computer.

* * * * *